United States Patent [19]

Ogawa

[11] Patent Number: 4,720,815
[45] Date of Patent: Jan. 19, 1988

[54] SEMICONDUCTOR MEMORY DEVICE IN FORM OF SHIFT REGISTER WITH TWO-PHASE CLOCK SIGNAL SUPPLY

[75] Inventor: Junji Ogawa, Tokyo, Japan
[73] Assignee: Fujitsu Limited, Kanagawa, Japan
[21] Appl. No.: 864,248
[22] Filed: May 19, 1986
[30] Foreign Application Priority Data
May 20, 1985 [JP] Japan ................................ 60-107824
[51] Int. Cl.⁴ ............................................. G11C 13/00
[52] U.S. Cl. ..................................... 365/78; 365/233; 377/64
[58] Field of Search ...................... 365/78, 73, 75, 154, 365/182, 189, 233; 377/64, 75

[56] References Cited
U.S. PATENT DOCUMENTS
4,641,278 2/1987 Saito ...................................... 365/78

Primary Examiner—Terrell W. Fears
Attorney, Agent, or Firm—Armstrong, Nikaido, Marmelstein & Kubovcik

[57] ABSTRACT

A semiconductor memory device in the form of a shift register is supplied with two-phase clock signals. One of the two-phase clock signal lines is connected to even order shift register elements of the shift register, and the other of the two-phase clock signal lines is connected to odd order shift register elements of the shift register. Each of the shift register elements includes an output node, a gate connected between the output node and a clock signal supplying node, a charge-up circuit responsive to the output signal of the preceding shift register element for preliminarily charging a control node of the gate, and a discharge circuit responsive to the output of the succeeding shift register element for releasing the charge of the control node of the gate.

4 Claims, 6 Drawing Figures

SEMICONDUCTOR MEMORY DEVICE IN FORM OF SHIFT REGISTER WITH TWO-PHASE CLOCK SIGNAL SUPPLY

BACKGROUND OF THE INVENTION

1. Field of the Invention

The present invention relates to a semiconductor memory device in the form of a shift register. The device according to the present invention is used, for example, for a video RAM in the field of information processing using a computer.

2. Description of the Related Arts

In general, the pointer control portion of a shift register used in connection with a video RAM is supplied with a first and second clock signals S(P1) and S(P2) of different phases. The data "1" in only one element (bit) of the pointer control portion is shifted successively through the elements of the pointer control portion in accordance with the supply of the clock signals S(P1) and S(P2).

In the prior art pointer control portion of a shift register, each element of the pointer control portion must be supplied with the clock signals S(P1) and S(P2). Hence, the structure of each element of the pointer control portion must be complicated.

In the prior art pointer control portion of a shift register, a preparation period is required for each element of the pointer control portion corresponding to a HIGH potential period of the second clock signal S(P2). Hence, the speed of the operation of the pointer control portion is low.

In the prior art pointer control portion of a shift register, the load of the first clock signal S(P1) is different from the load of the second clock signal S(P2). Hence, the structures of the circuits generating the first and second clock signals are complicated.

SUMMARY OF THE INVENTION

It is an object of the present invention to provide an improved semiconductor memory device in the form of a shift register in which only first and second clock signals of different phases are used, the number of the transistors required for each element of the shift register is reduced, and the structure of the circuit is accordingly simplified.

It is another object of the present invention to provide an improved semiconductor memory device in the form of a shift register in which the time length of one shift cycle period of the shift register is reduced, and the speed of the operation of the shift register is accordingly enhanced.

It is still another object of the present invention to provide an improved semiconductor memory device in the form of a shift register in which the same load is loaded for each of the first and second clock signal outputs S(P1) and S(P2), and the structure of the circuit for generating the two-phase clock signals is accordingly simplified.

According to the present invention, there is provided a semiconductor memory device in the form of a shift register with first and second clock signal lines including: a sequence of shift register elements; and first and second clock signal lines for supplying the shift register elements with first and second clock signals of different phases, respectively, said first and second clock signals having waveforms which do not overlap each other. The first two-phase clock signal line is connected to even order shift register elements of the shift register, and the second clock signal line is connected to odd order shift register elements of the shift register. Each of the shift register elements includes: an output node for producing an output signal; a clock signal supplying node for receiving one of first and second clock signals; a gate connected between the output node and the clock signal supplying node and having a control gate; a charge-up circuit responsive to the output signal of the preceding shift register element for preliminarily charging the control node of the gate; and a discharge circuit responsive to the output of the succeeding shift register element for releasing the charge of the control node of the gate.

BRIEF DESCRIPTION OF THE DRAWINGS

In the drawings, FIG. 1 comprised of FIGS. 1a and 1b shows the circuit structure for the elements of a prior art shift register.

DESCRIPTION OF THE PREFERRED EMBODIMENTS

Before describing a preferred embodiment of the present invention, an example of the prior art pointer control portion of a shift register is described with reference to FIGS. 1 and 2.

Figure 1A:
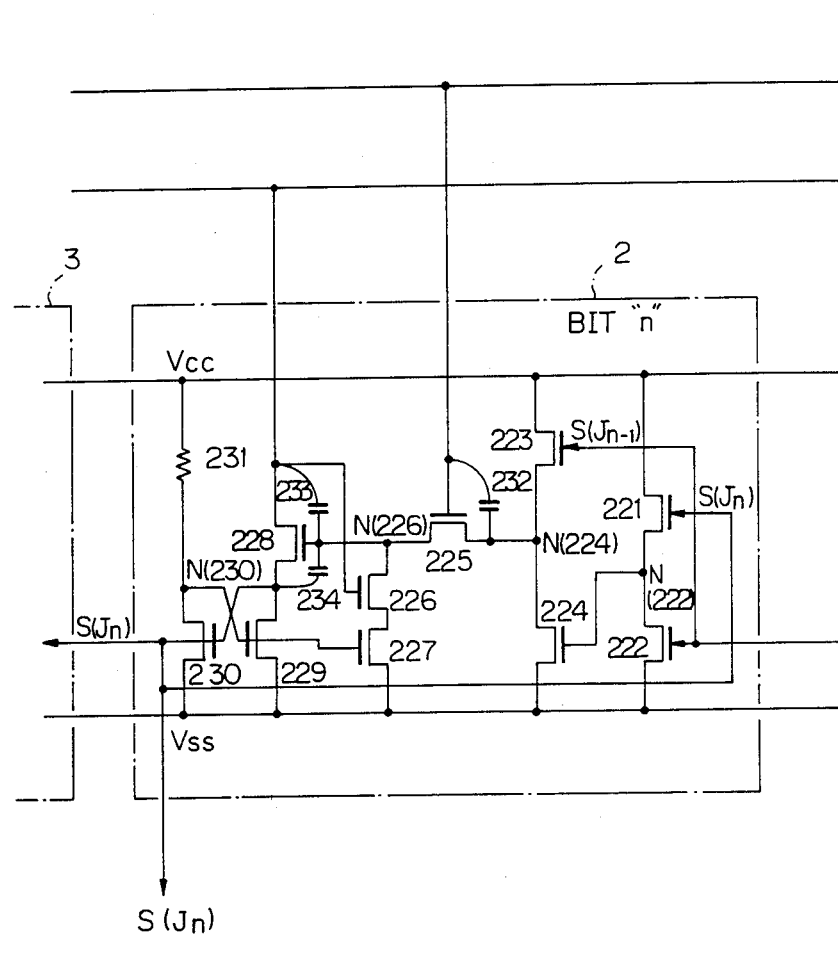
Figure 1B:
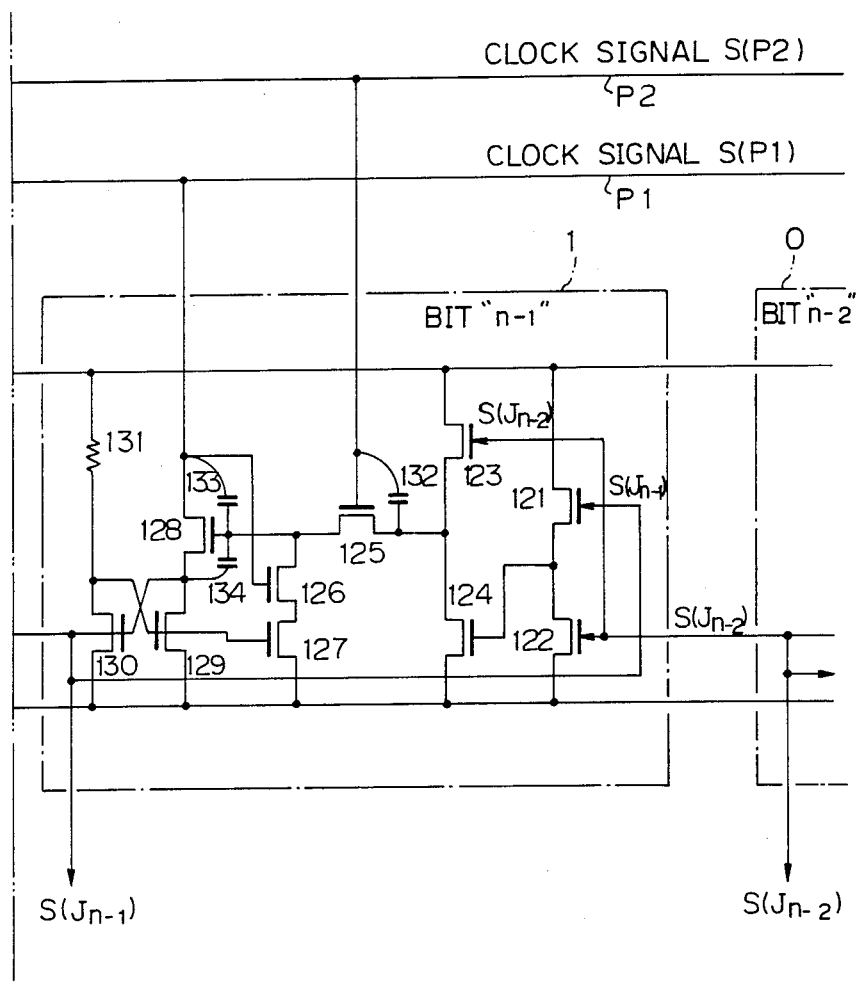

In FIG. 1, a sequence of elements (bits) 0, 1, 2, 3, ... of a pointer control portion of a shift register is shown. The elements 0, 1, 2, and 3 correspond to a bit "n−2", bit "n−1", bit "n", and bit "n+1", respectively. Each element of the pointer control portion is supplied with a first phase clock signal S(P1) from a first clock signal line P1 and a second phase clock signal S(P2) from a second signal line P2.

The element 2 includes N channel MOS transistors 221, 222, 223, 224, 225, 226, 227, 228, 229, and 230, a resistor 231, and capacitors 232, 233, and 234.

It is assumed that the preceding element 1 produces a signal "1" of the output signal $S(J_{n-1})$, the potential of the clock signal S(P1) is HIGH and the potential of the clock signal S(P2) is LOW, and thus the potential of the output signal $S(J_{n-1})$ of the preceding element 1 is HIGH, and the potential of the output signal $S(J_n)$ of the present element 2 is LOW. The transistor 221 is in an OFF state, the transistor 222 is in an ON state, and the potential of the node N(222) becomes LOW.

Hence, the transistor 224 is in an OFF state, the transistor 223 is in an ON state, and the potential of the node N(224) becomes HIGH. When the potential of the clock signal S(P2) is changed from LOW to HIGH, the transistor 225 is turned ON, the charge is moved from the node N(224) to the node N(226) to prepare the potential of the node N(226) to become HIGH. At this moment, the potential of the clock signal S(P1) is LOW, and the transistor 226 is in an OFF state.

It is assumed that the transistor 230 of the latch circuit is in an OFF state, the transistor 229 of the latch circuit is in an ON state, the potential of the node N(230) is HIGH, and the potential of the output signal $S(J_n)$ is LOW. When the potential of the clock signal S(P2) becomes LOW, and the potential of the clock signal S(P1) becomes HIGH, the HIGH potential of the clock signal S(P1) is transferred to the latch circuit to reverse the states of the transistors 230 and 229, so that the potential of the output signal $S(J_n)$ becomes HIGH, that is "1".

This means that the "1" signal of the output signal of the preceding element 1 has been transferred to the "1" signal of the output signal of the present element 2.

Thus, while the potential of the clock signal S(P1) is HIGH, that is "1", the potential of the output signal $S(J_n)$ is HIGH, that is "1".

While the potential of the clock signal S(P1) is HIGH, that is "1", the transistor 221 is caused to be in an ON state because of the HIGH potential of the output signal $S(J_n)$, the potential of the node N(222) is caused to be HIGH, the transistor 224 is caused to be in an ON state, the charge of the node N(224) is discharged, and accordingly, the potential of the node N(224) is caused to be LOW.

When the potential of the clock signal S(P2) becomes HIGH, the charge of the node N(226) is discharged, and accordingly, the potential of the node N(226) is caused to be LOW.

The transistor 226 is turned ON upon the change to HIGH of the potential of the clock signal S(P1). Then, the potential of the node N(226) is maintained at the $V_{SS}$ potential, that is LOW, through the transistors 226 and 227 which are in an ON state.

Figure 2:
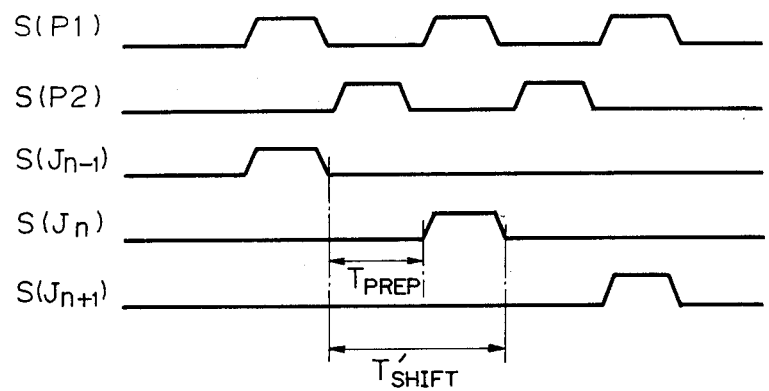
FIG. 2 shows the waveforms of the signals in the circuit of FIG. 1.

The waveforms of the signals in the circuit of FIG. 1 are shown in FIG. 2. With regard to the element 1 of bit "n", one shift cycle period $T'_{SHIFT}$ is given as a period elapsing between the falling of the signal $S(J_{n-1})$ and the falling of the signal $S(J_n)$. As shown in FIG. 2, a relatively long one shift cycle period $T'_{SHIFT}$ is required. A preparatory period $T_{PREP}$, in which the potential of the signal $S(J_n)$ is LOW before the HIGH potential period of the signal $S(J_n)$, is needed in the circuit of FIG. 1.

It will be understood that the structure of each element of the shift register is relatively complicated, the structures of the circuits of generation of the two-phase clock signals are relatively complicated, and the operation speed of the shift register is relatively low, in the circuit of FIG. 1.

Figure 3:
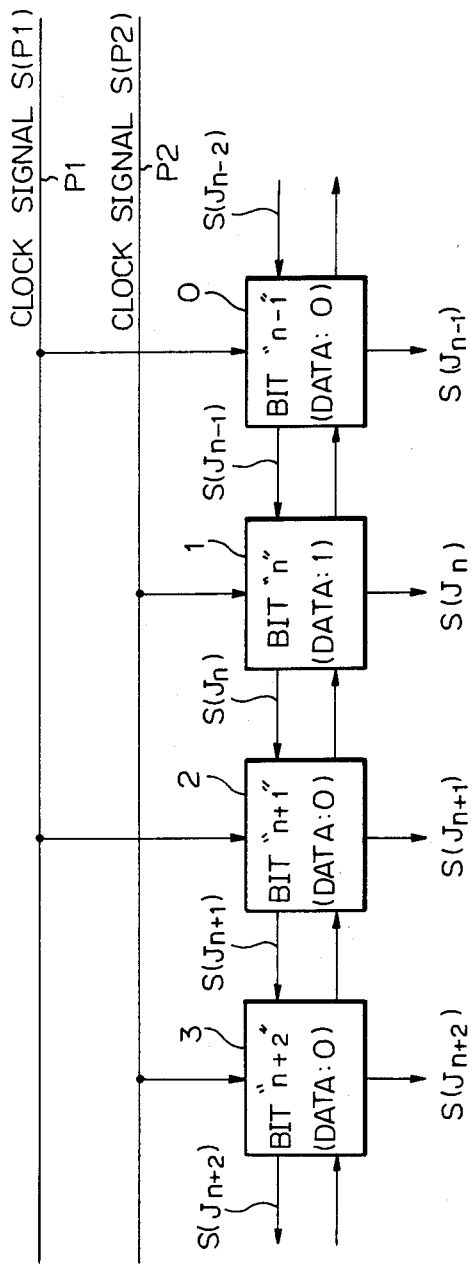
FIG. 3 shows the fundamental arrangement of the shift register according to an embodiment of the present invention.
Figure 4A:
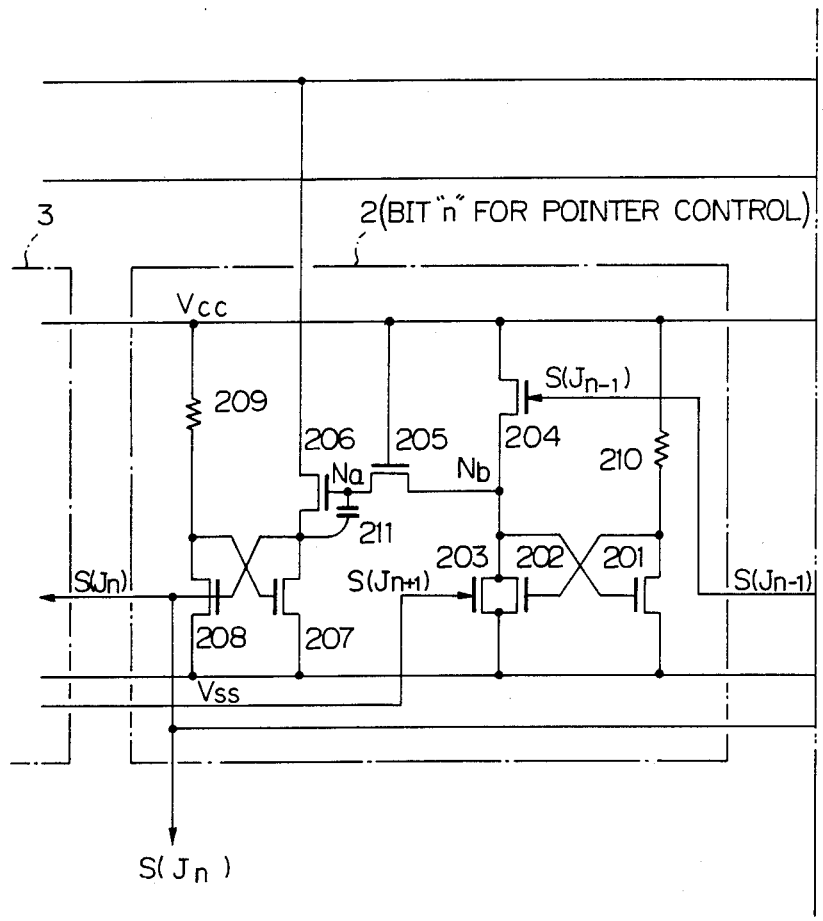
FIG. 4 comprised of FIGS. 4a and 4b shows the circuit structure for the elements of the shift register of FIG. 3.
Figure 4B:
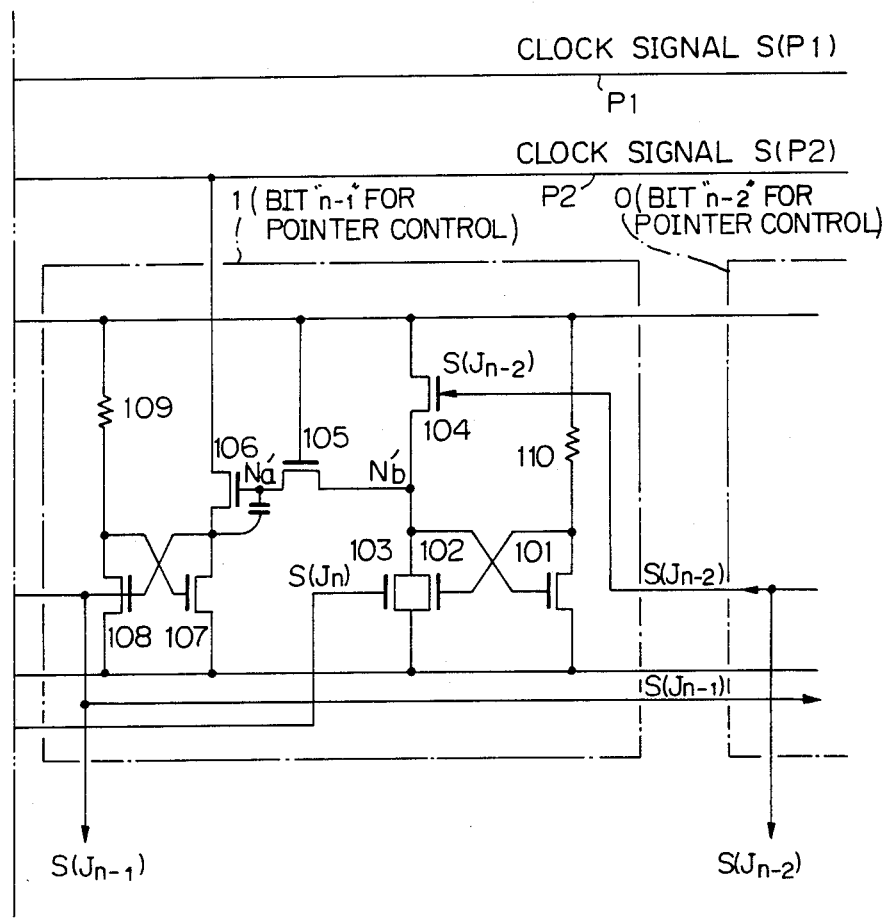

The fundamental arrangement of a semiconductor memory device in the form of a shift register with two-phase clock signal lines according to an embodiment of the present invention is shown in FIG. 3. The schematic diagram of the shift register elements of the shift register shown in FIG. 3 is shown in FIG. 4.

In FIG. 3, a shift register consists of shift register elements 0, 1, 2, 3, . . . . The shift register elements 1, 2, 3, . . . correspond to a bit "n−1", bit "n", bit "n+1", bit "n+2", . . . . It is assumed that data "0", data "1", data "0", and "data 0" are stored in the shift register elements 0, 1, 2, and 3. The outputs $S(J_{n-1})$, $S(J_n)$, $S(J_{n+1})$, and $S(J_{n+2})$ are delivered from the shift register elements 0, 1, 2, and 3.

In FIG. 3, the clock signal P2 line is connected to the odd order shift register elements 1 and 3, while the clock signal P1 line is connected to the even order shift register elements 0, 2, and 4.

Hence, each of the shift register elements receives only a single one-phase clock signal. As will be described later, this single one-phase clock signal serves as both an activation signal and a resetting signal.

The circuit structure for the elements 1 and 2 of the shift register of FIG. 3 is shown in FIG. 4. The element 1 should be regarded as the element preceding the element 2 in question.

The present element 2 includes N channel MOS transistors 201, 202, 203, 204, 205, 206, 207, and 208, resistors 209 and 210, and a capacitor 211. The transistors 207 and 208, and the resistor 209 form a latch circuit coupled to the output node $S(J_n)$. This latch circuit fixes the potential of the output node $S(J_n)$ to zero when there is no "1" output signal of $S(J_n)$. The node $S(J_n)$ of the latch is connected through the transfer gate transistor 206 to the clock signal line P2.

The potential of the node $N_a$ at a gate of the transistor 206 is brought to a HIGH potential through the transistor 205 by the transistor 204, the gate of which is supplied with the signal $S(J_{n-1})$ which is the output signal of the preceding element 1 of the shift register.

The charge of the nodes $N_a$ and $N_b$ is discharged by the operation of the transistor 203 when the potential of the output signal $S(J_{n+1})$ of the succeeding element of the shift register reaches a HIGH potential.

A latch circuit is formed by cross-connected transistors 201 and 202 to prevent the potentials of the nodes $N_a$ and $N_b$ from floating while the nodes $N_a$ and $N_b$ are at a LOW potential.

The operation of the circuit shown in FIG. 4 will be described below.

(i) The nth element 2 is supplied with the clock signal P2, and the n−1th and n+1th elements 1 and 3 are supplied with the clock signal P1.

(ii) It is assumed that the potential of the clock signal P1 is HIGH to cause the output signal $S(J_{n-1})$ to be delivered, and the potential of the output signal $S(J_{n-1})$ is "1", that is HIGH.

Under this condition, the output signals $S(J_n)$ and $S(J_{n+1})$ are not delivered, and the potentials of the output signals $S(J_n)$ and $S(J_{n+1})$ are "0", that is LOW.

(iii) The preceding element 1 delivers the output signal $S(J_{n-1})$, and the potential of the output signal $S(J_{n-1})$ is HIGH. Hence, the transistor 204 turns ON, and the node $N_b$ is charged up. At the same time, the node $N_a$ is charged up through the transistor 205. During the above-described operation, the states of the transistors 201 and 202 are reversed, and the transistor 201 turns ON while the transistor 202 turns OFF. The transistor 203 is in an OFF state, since the potential of the signal $S(J_{n+1})$ is LOW.

(iv) The potential of the clock signal P1 is LOW. Hence, the signal $S(J_n)$ is not changed even when the transistor 206 turns ON.

(v) The potential of the clock signal falls. Hence, the potential of the signal $S(J_{n-1})$ becomes LOW. However, the transistor 201 and 202 latches the state of the circuit. Hence, the potentials of the nodes $N_a$ and $N_b$ are the same as in the state indicated in (iii), above.

(vi) The potential of the clock signal P1 falls and the potential of the clock signal P2 rises. Hence, the potential of the node $N_a$ is boosted to a HIGH level, and the clock signal P2 is transferred quickly by the transistor 206. Hence, the states of the transistors 207 and 208 are reversed, and the potential of the output signal $S(J_n)$ becomes HIGH to deliver the output signal $S(J_n)$ of "1".

(vii) The signal $S(J_n)$ is supplied to the gate of the transistor 103 of the preceding element corresponding to the transistor 203 of the present element. Hence, the charge of the nodes $N'_a$ and $N'_b$ of the preceding element is discharged, and the states of the transistors 101 and 102 of the preceding element are latched to latch the potential of the node $N'_b$ of the preceding element at LOW.

In the circuit of FIG. 4, a common clock signal is not supplied to any two adjacent elements of the shift register. In each of the elements of the shift register, a one phase clock signal serves both as an activation signal and a resetting signal. The preparation for the operation is carried out only by supplying the charging transistor, such as transistor 204, with the output signal of the preceding element. The discharge of the node is carried out by a simple process whereby the output signal of the succeeding element is fed back to the gate of the discharging transistor, such as transistor 203.

Figure 5:
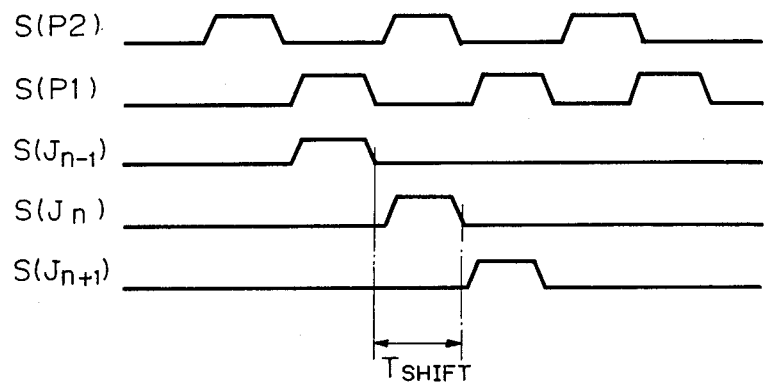
FIG. 5 shows the waveforms of the signals in the circuit of FIG. 4.

The waveforms of the signals in the circuit of FIG. 3 are shown in FIG. 5. In FIG. 5, the waveforms of first phase clock signal $S(P1)$, second phase clock signal $S(P2)$, output signal $S(J_{n-1})$ of the preceding element, output signal $S(J_n)$ of the present element, and output signal $S(J_{n+1})$ of the succeeding element of the shift register are shown.

With regard to the element 1 of bit "n" (FIG. 3), one shift cycle period $T_{SHIFT}$ is given as a period elapsing between the falling of the signal $S(J_{n-1})$ and the falling of the signal $S(J_n)$.

As shown in FIG. 5, a relatively short one shift cycle period $T_{SHIFT}$ is realized, which enables a relatively high speed operation of the shift register.

Contrary to this, as shown by the waveforms of the signals in the circuit of FIG. 1 shown in FIG. 2, with regard to the element 1 of bit "n" (FIG. 1), one shift cycle period $T'_{SHIFT}$ is given as a period elapsing between the falling of the signal $S(J_{n-1})$ and the falling of the signal $S(J_n)$. As shown in FIG. 2, a relatively long one shift cycle period $T'_{SHIFT}$ is required, which prevents a high speed operation at the shift register.

Figure 6:
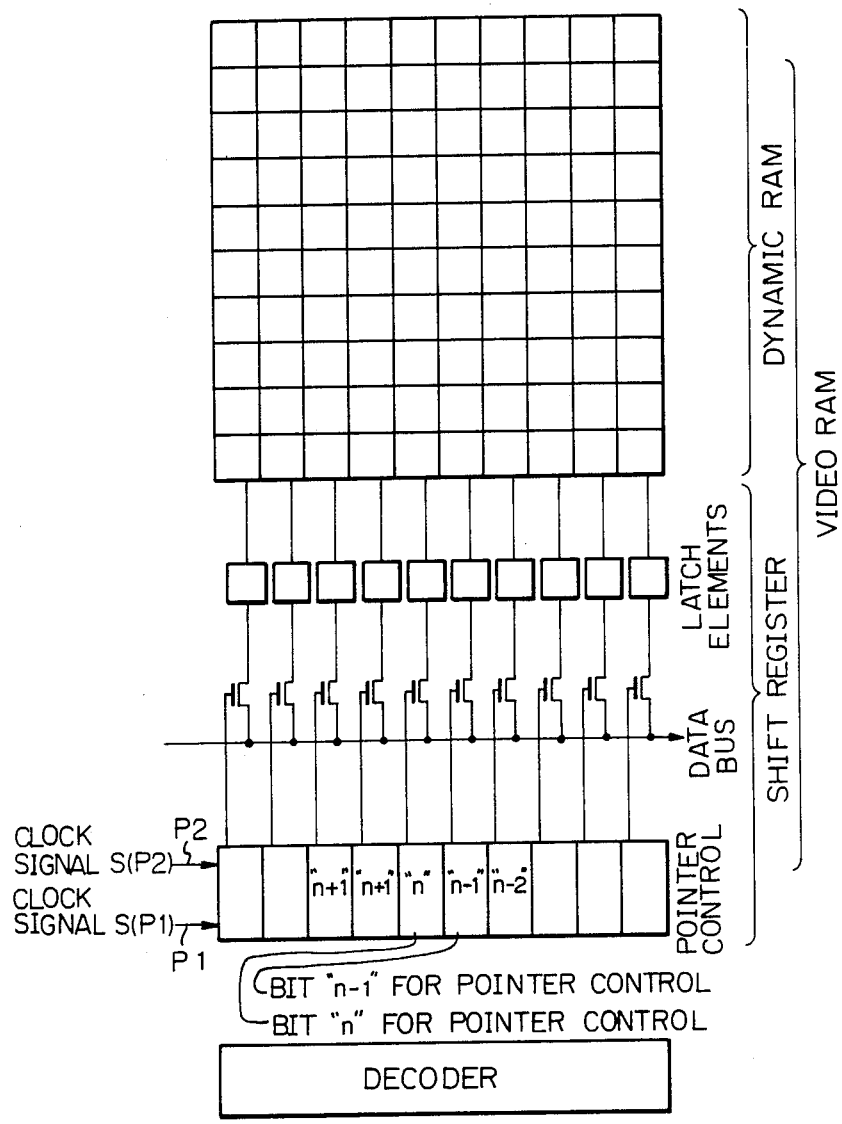
FIG. 6 shows a video RAM to which the shift register according to an embodiment of the present invention is applicable.

An example of the application of the shift register according to the present invention is shown in FIG. 6. The device shown in FIG. 6 is a video RAM in association with a shift register as an embodiment of the present invention. Between the dynamic RAM and the data bus, the series-connected latch element and field effect transistor is connected. The output signal of the pointer control of the shift register is supplied to the gate of the field effect transistor.

I claim:

1. A semiconductor memory device in the form of a shift register with two clock signal lines comprising:
    a sequence of shift register elements; and
    first and second clock signal lines for supplying said shift register elements with first and second clock signals of first and second phases respectively, said first and second clock signals having waveforms which do not overlap each other;
    said first clock signal line being connected to even order shift register elements of said shift register, said second clock signal line being connected to odd order shift register elements of said shift register;
    each of said shift register elements comprising:
    an output node for producing an output signal;
    a clock signal supplying node for receiving one of said first and second clock signals;
    a gate connected between said output node and said clock signal supplying node and having a control gate;
    a charge-up circuit responsive to the output signal of the preceding shift register element for preliminary charging said control node of said gate; and
    a discharge circuit responsive to the output of the succeeding shift register element for releasing the charge of said control node of said gate.

2. A device according to claim 1, wherein each of said shift register elements further comprises a latch circuit having a potential maintenance function connected to said output node of each of said shift register elements.

3. A device according to claim 1, wherein each of said shift register elements further comprises a latch circuit having a potential maintenance function connected to the input side of each of said shift register elements.

4. A device according to claim 2, wherein each of said shift register elements further comprises a latch circuit having a potential maintenance function connected to the input side of each of said shift register elements.

* * * * *